United States Patent
Romanov et al.

(10) Patent No.: US 7,250,782 B2
(45) Date of Patent: Jul. 31, 2007

(54) METHOD FOR TESTING NON-COMPONENTED CIRCUIT BOARDS

(75) Inventors: Victor Romanov, Wertheim (DE); Oleh Yuschuk, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 11/225,334

(22) Filed: Sep. 13, 2005

(65) Prior Publication Data

US 2006/0006891 A1    Jan. 12, 2006

Related U.S. Application Data

(63) Continuation of application No. PCT/EP2004/002420, filed on Mar. 9, 2004.

(30) Foreign Application Priority Data

May 9, 2003  (DE) ................. 103 20 925

(51) Int. Cl.
*G01R 31/02* (2006.01)
(52) U.S. Cl. .................................. 324/756
(58) Field of Classification Search .............. None
See application file for complete search history.

(56) References Cited

U.S. PATENT DOCUMENTS

| | | | |
|---|---|---|---|
| 4,123,706 A * | 10/1978 | Roch ........................... 324/754 |
| 4,749,945 A * | 6/1988 | Bonifert et al. ............. 324/755 |
| 4,926,345 A | 5/1990 | Novak et al. |
| 5,086,556 A | 2/1992 | Toi |
| 5,394,100 A * | 2/1995 | Bohler et al. ............... 324/758 |
| 5,489,855 A * | 2/1996 | Poisel ......................... 324/762 |
| 5,995,232 A | 11/1999 | Van Der Ven |
| 6,091,256 A * | 7/2000 | Long et al. .................. 327/762 |
| 6,344,751 B1 * | 2/2002 | Prokopp et al. ............. 324/754 |
| 6,677,773 B2 * | 1/2004 | Prokopp ..................... 324/761 |
| 2001/0024119 A1 * | 9/2001 | Stockford ................. 324/158.1 |
| 2005/0001639 A1 * | 1/2005 | Romanov .................... 324/754 |
| 2005/0083038 A1 * | 4/2005 | Rothaug et al. ......... 324/158.1 |
| 2005/0206398 A1 * | 9/2005 | Romanov .................... 324/754 |

FOREIGN PATENT DOCUMENTS

| | | |
|---|---|---|
| JP | 02 130477 A | 5/1990 |
| JP | 10 038980 A | 2/1998 |
| JP | 11 145582 A | 5/1999 |

OTHER PUBLICATIONS

International Preliminary Report on Patentability from International Application No. PCT/EP2004/002420, filed on Mar. 9, 2004.

* cited by examiner

*Primary Examiner*—Jermele Hollington
(74) *Attorney, Agent, or Firm*—Houston Eliseeva LLP

(57) ABSTRACT

A method of testing circuit boards, in particular non-componented circuit boards in which the level of the surface of a circuit board to be tested is detected automatically in a contacting process, and the further contacting operations are then controlled on the basis of the level detected. By this process, the control of the movement of the test probes of the finger tester effects automatic matching to the level, which is of particular advantage in the testing of flexible circuit boards, since their surface may have a three-dimensional form.

37 Claims, 8 Drawing Sheets

METHOD FOR TESTING NON-COMPONENTED CIRCUIT BOARDS

RELATED APPLICATIONS

This application is a Continuation of PCT/EP2004/002420, filed Mar. 9, 2004 (which was published in German under PCT Article 21(2) as International Publication No. WO 2004/099802 A1), which claims priority to German Application No. DE 103 20 925.5, filed May 9, 2003, both applications being incorporated herein by reference in their entirety.

BACKGROUND OF THE INVENTION

Testers for the testing of circuit boards may in principle be divided into two groups, those with finger testers and those with parallel testers. The parallel testers are testers which, by means of an adapter, contact simultaneously all or at least the majority of circuit board test points of a circuit board to be tested. Finger testers are testers for the testing of non-componented or componented circuit boards, which scan the individual contact points sequentially using two or more test fingers.

In the testing of non-componented printed circuit boards, as compared with the testing of componented circuit boards, i.e. in-circuit testing, it is necessary to contact significantly more circuit board test points. For this reason the main criterion for successful marketing of a finger tester for non-componented printed circuit boards is the throughput of contacted circuit board test points within a predetermined period of time.

The test fingers are generally fixed to a slide which is able to traverse along a cross-bar, while the cross-bars are in turn guided and able to traverse on guide rails. The slides may thus be positioned at any desired point on a test array which is usually rectangular. To contact a contact point of a circuit board to be tested, the slide is able to move vertically on the cross-bar, so that the test finger may be placed on the contact point from above or from below.

A finger tester is described in EP 0 468 153 A1 and a method of testing circuit boards using a finger tester is described in EP 0 853 242 A1.

JP 02-130477 A discloses a method of testing circuit boards using a finger tester with one test finger which is automatically traversed to contact circuit board test points of a circuit board to be tested. The test finger has a test probe with two contact tips. Using the two contact tips and a contacting sensor, the point in time is determined at which the test probe makes contact with a circuit board test point of the circuit board to be tested. The level of the surface of the circuit board test point is determined with the aid of this point in time and the position of the probe tips.

U.S. Pat. No. 4,926,345 discloses an apparatus for the trimming of conductor paths. This involves the conductor paths being cut to the desired width by means of an automatically traversing cutter. However, before cutting take place, the course of the conductor path and also a vertical profile of the circuit board are determined by means of a sensor, so that the cutting operation may be performed with the desired accuracy.

U.S. Pat. No. 5,489,855 describes a finger tester with several test fingers.

SUMMARY OF THE INVENTION

The invention relates to a method of testing non-componented printed circuit boards using a finger tester with several fingers which are automatically traversed to contact circuit board test points of a circuit board to be tested.

A problem that can be addressed by the invention is to develop a method for the testing of non-componented printed circuit boards by means of a finger tester in such a way that the throughput of contacted circuit board test points within a predetermined time may be further increased.

The problem is solved by a method with the features described below and in the claims.

In the method according to the invention of testing non-componented printed circuit boards using a finger tester with several test fingers which are automatically traversed to contact circuit board test points of a circuit board to be tested and in which each of the test fingers has a test probe provided with a contacting sensor, the level of the surface of the circuit board to be tested is determined when a probe tip of the test probe comes into contact with the surface of the circuit board to be tested so that, with the aid of this point in time and the position of the probe tip at this point in time, this level is determined and further contacting processes for contacting circuit board test points may be controlled on the basis of the determined level.

Since the movement of the test finger may be controlled on the basis of an actually determined level of the surface of the circuit board, the test fingers may be moved at greater speed close to the surface of the circuit board, and then braked only on reaching the surface of the circuit board or shortly beforehand, for the contacting of a circuit board test point.

Using conventional methods, owing to the different levels of circuit boards inserted in the tester, the movement of the test finger is braked to a low speed much earlier so that, in contacting the circuit board, the circuit board test points are not damaged. With the invention it is possible to move at a higher speed significantly closer to the surface of the circuit board, without thereby incurring any risk of damage to the surface of the circuit board.

The method according to the invention is thus faster than conventional methods and avoids damage to the surface of the circuit board.

According to a preferred method, the level is detected at several points on the surface of the circuit board and, with the aid of the detected level, the surface of the circuit board is simulated by methods of interpolation. By this means one obtains a mathematical model of the surface of the circuit board, which may be used to calculate the level of any desired point on the circuit board. This level is then used in controlling the individual contacting operations for the contacting of further circuit board test points.

The simulated surface may also be used to determine deviations of the X coordinates and the Y coordinates of the circuit board test points to be contacted.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

The invention is explained below with the aid of the embodiments shown in the drawings, which contain as.

DETAILED DESCRIPTION OF THE PREFERRED EMBODIMENTS

Figure 1:
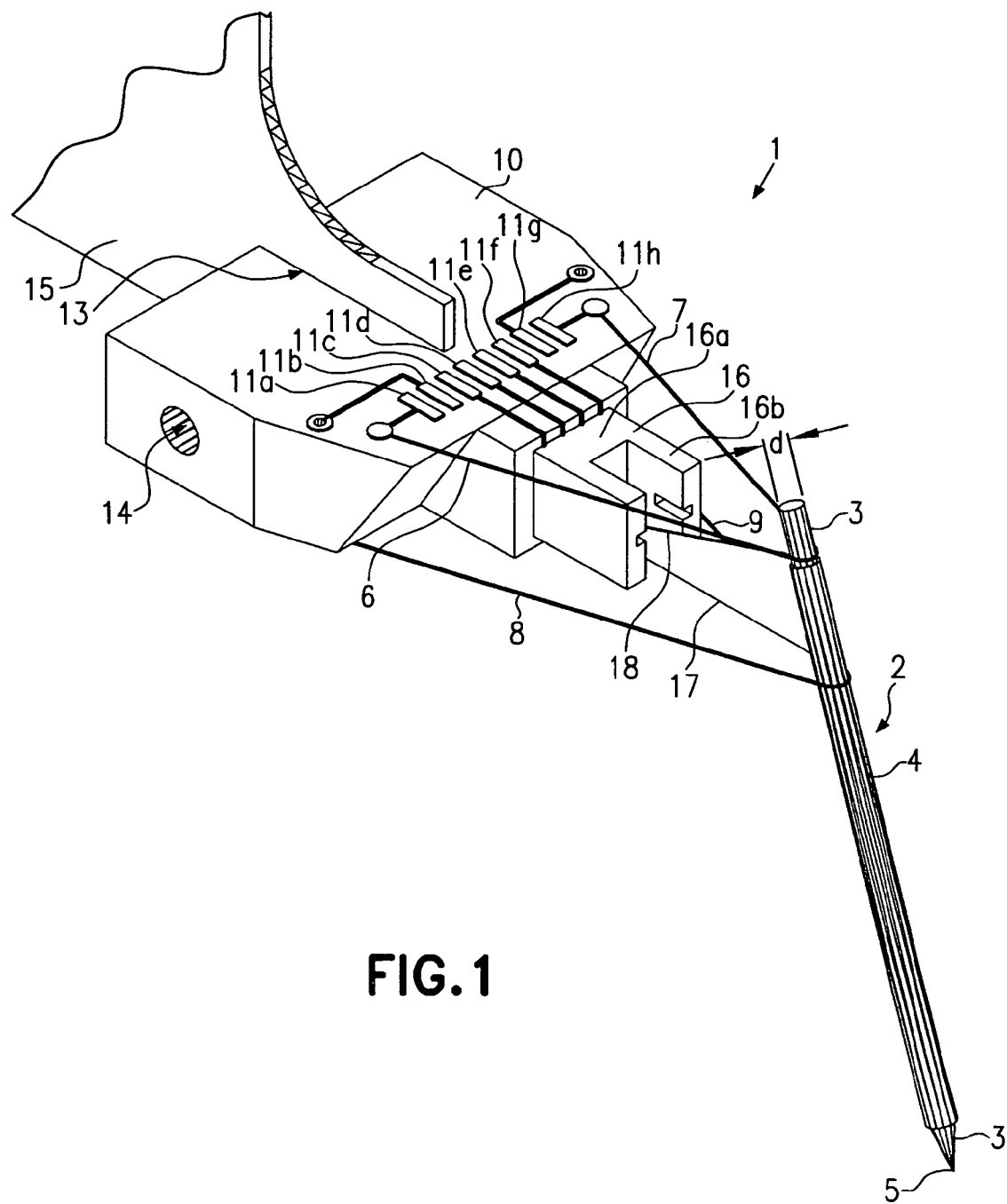
FIG. 1 is a perspective view of a first embodiment of a test probe according to the invention.
Figure 2:
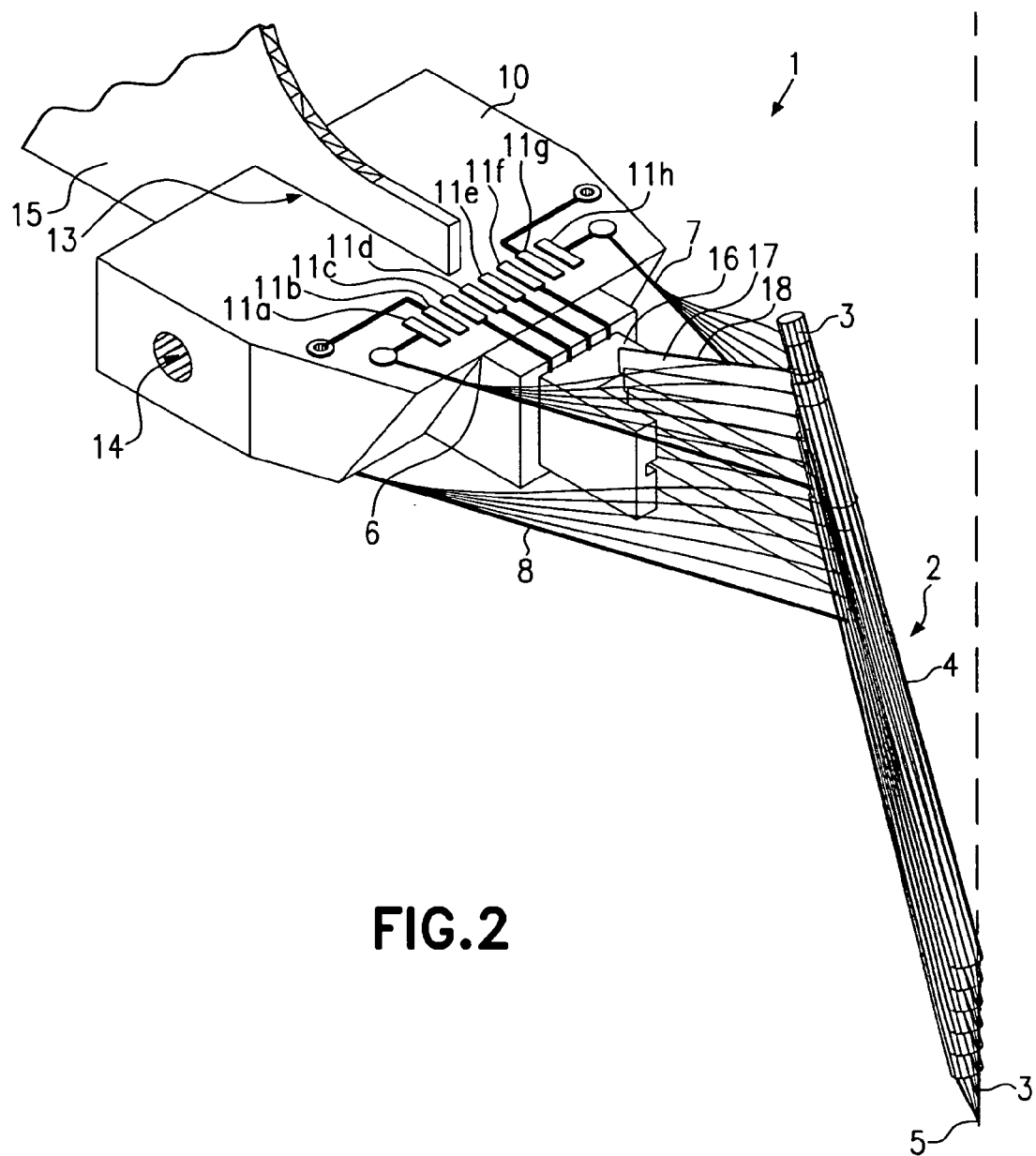
FIG. 2 is a perspective view of the test probe of FIG. 1, with the test needle shown in both the original position and in deflected positions.

FIGS. 1 and 2 show a first embodiment of a test probe 1 according to the invention. The test probe has a test needle 2 which in the present embodiment is in the form of a needle 3 with a diameter d of 0.3 to 0.5 millimeters (mm). The needle 3 is made of steel or tungsten and is covered by an insulating layer, made e.g. of Teflon. The covering is in turn coated with an electrically conductive layer. This covering with the electrically conductive layer forms a shield 4 which shields the needle 3 from electrical fields. The needle 3 projects out from the shield 4 at both ends, with one of the two ends tapering to form a probe tip 5. At the end opposite the contact tip, the test needle 2 or needle 3 is connected to two retaining arms 6, 7, subsequently referred to as the upper retaining arms. Two further retaining arms 8, 9 are attached to the shield 4 a short distance from the connection point between the upper retaining arms 6, 7 and the test needle 2. The retaining arms 8, 9 are described as lower retaining arms. Each of the two pairs of retaining arms 6, 7 and 8, 9 respectively are made of a wire element bent in the middle, with the test needle 2 attached at the bending point by means of an electrically conductive connection, such as for example a soldered connection. The two pairs of retaining arms 6, 7 and 8, 9 respectively thus form in each case an isosceles triangle, with the test needle 2 located at the apex of the isosceles triangle.

At their ends which are furthest away from the test needle 2, the retaining arms 6 to 9 are fastened to a mount 10. The mount 10 is an electrically insulating plastic part, provided on its top with a series of contact pads 11a–11h. Each of the upper retaining arms 6, 7 is connected electrically via conductor paths to the contact pads 11a and 11h respectively. Each of the lower retaining arms 8, 9 is connected electrically to the contact pads 11b and 11g respectively by a metal pin 12 (FIG. 4) extending vertically through the mount 10 and a conductor path.

These contact pads 11a to 11h are connected by further conductor paths (not shown) to an electrical plug connector (not shown) formed on the mount 10. The mount 10 is formed as a plug-in element which may be inserted into a test head of a finger tester. In the present embodiment, the mount 10 has a slot 13 which leads to the side face of the mount 10 which is furthest from the test needle 2. The mount 10 also has a through hole 14 arranged at right-angles to the slot 13. The mount 10 can thus be pushed by the slot on to a thin wall 15 of the test head and fixed by means of a pin passing through the through hole 14 of the mount and a corresponding through hole in the wall 15. When the mount 10 is slid or placed on the wall 15 of the test head, the conductor paths connected to the contact pads 11a to 11h are at the same time electrically connected to the corresponding conductor paths of the test head.

On the mount 10, a photoelectric switch element 16 is mounted on the side face adjacent to the test needle 2. Viewed from above the photoelectric switch element 16 is U-shaped with a base 16a and two limbs 16b. On the inside of the end section of one of the two limbs 16b is a light source, while the other limb 16b is provided with a light sensor which receives the light signal. The light source and the light sensor thus form an optical measuring section. In the horizontal plane the light source and the light sensor have a certain longitudinal extent, e.g. 1 mm. Fastened to the test needle 2 is a measuring vane 17, made for example from a thin metal sheet. This measuring vane lies in a longitudinal centre plane of the test probe 1 which is aligned vertically and forms the mirror plane to the retaining arms 6 and 7, and 8 and 9 respectively. The upper edge of the measuring vane 17 is designed as a measuring edge 18 and runs in the original position shown in FIG. 1, in which the retaining arms 6 to 9 run in a straight line, at an angle to a horizontal plane and is located directly below the optical measuring section.

When the test probe 1 is placed on a circuit board to be tested, the test needle 2 is subjected to a force which causes the retaining arms to swivel from the original position into a deflected position (upwards in FIGS. 1 and 2). By this means the measuring vane 17 is guided into the optical measuring section. Through the provision of the angled measuring edge 18, the optical measuring section is interrupted in proportion to the movement of the test needle relative to the mount 10, so that the signal measured by the photoelectric switch is proportional to the movement path of the test needle.

The photoelectric switch element 16 is connected via four conductor paths to each of the contact pads 11c to 11f which, like the other contact pads, are connected to the test head by means of an electrical plug connector.

Figure 5:
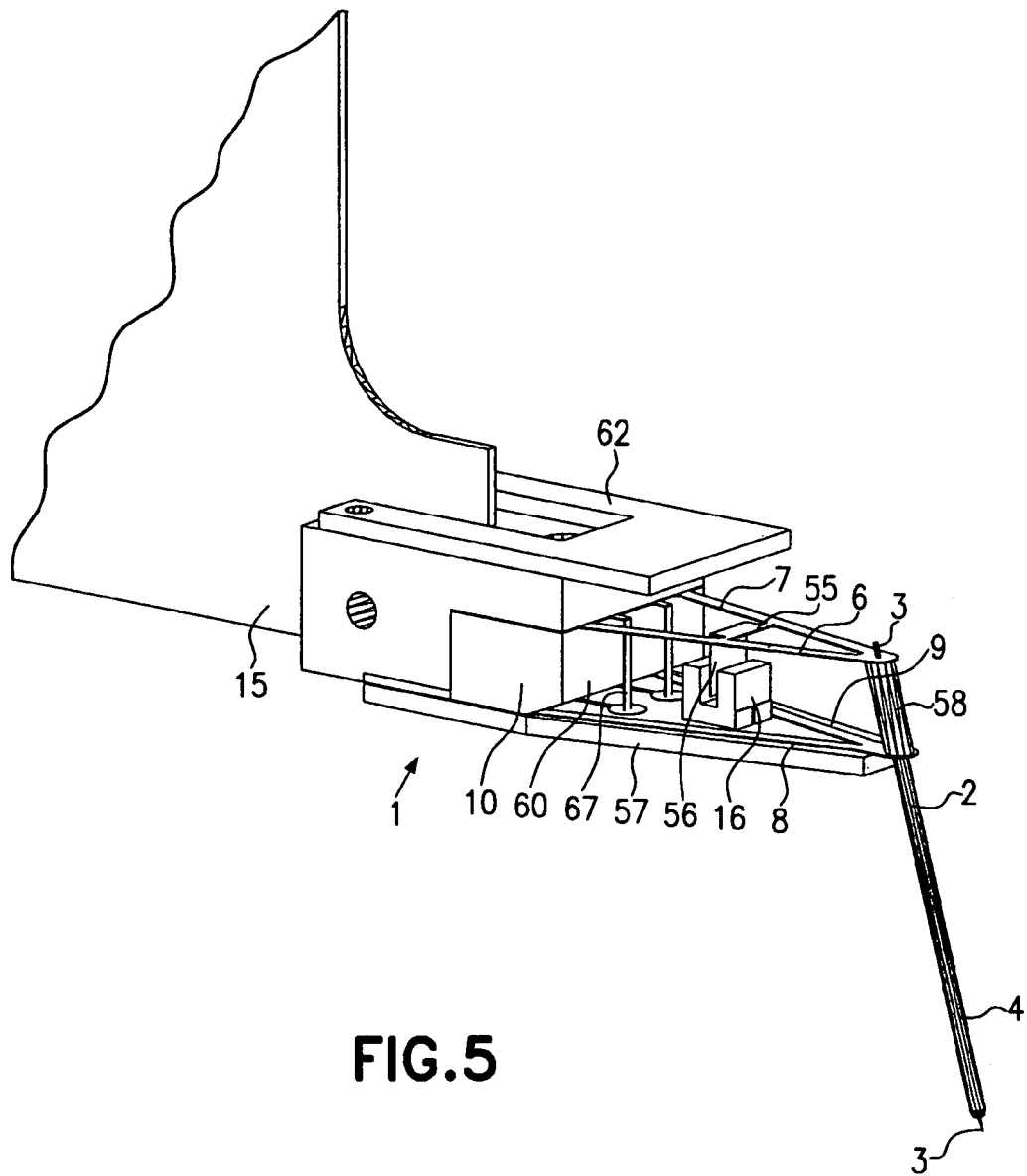
FIG. 5 is a perspective view of a third embodiment of a test probe according to the invention.
Figure 7:
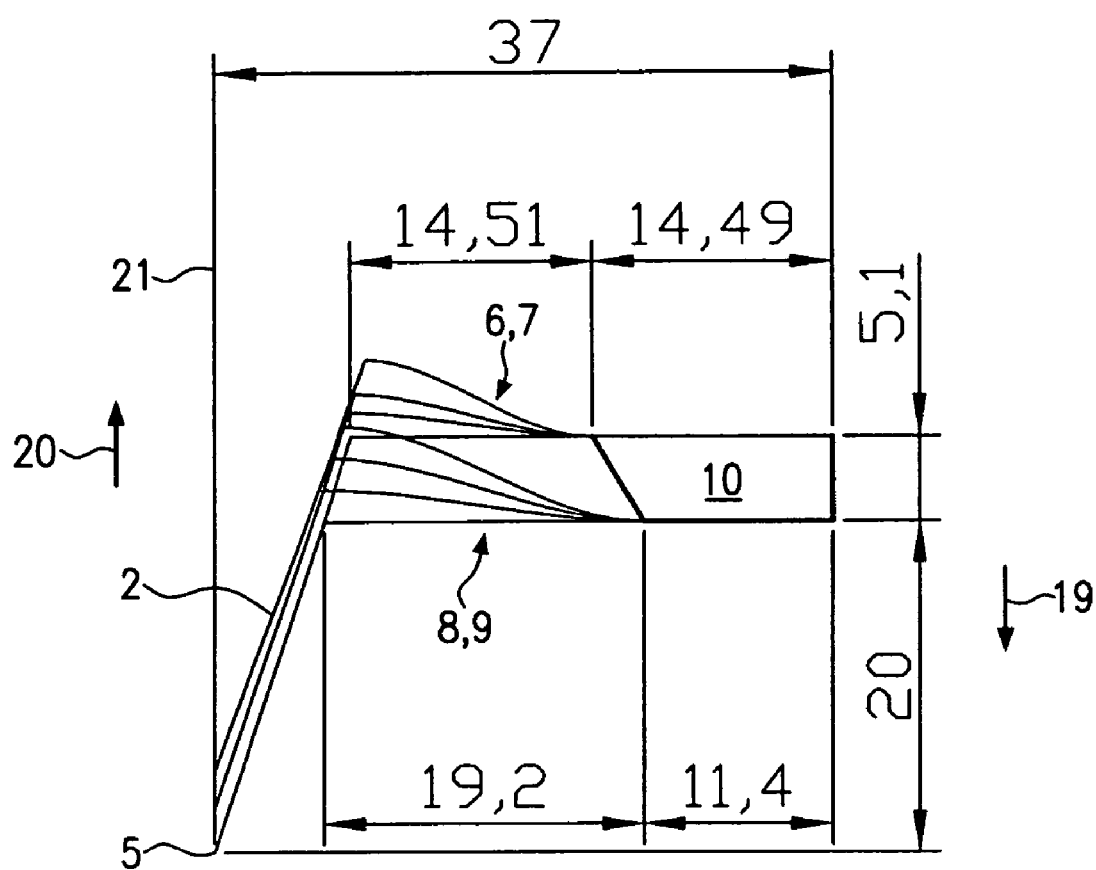
FIG. 7 is a schematic side view of a test probe according to the invention, with dimensions.

FIG. 7 shows in schematic form the test probe 1 according to the invention in a side view with the mount 10 and the upper and lower retaining arms 6, 7 and 8, 9 respectively, and the test needle 2. When the test probe 1 is brought into contact with a circuit board to be tested, the test probe 1 is placed by the probe tip 5 on the circuit board (direction 19). This involves movement of the test needle 2 relative to the mount 10 in the direction of arrow 20 (upwards in FIG. 5). This direction 20 is subsequently described as the direction of movement 20 of the test needle 2. Viewed from the side, the upper and lower retaining arms 6, 7 and 8, 9, together with the corresponding boundary edge of the mount 10 and the section of the test needle 2 located between the upper and lower retaining arms, form a trapezium. The lengths of the individual sections, given in millimeters in FIG. 7, are so dimensioned that, in movement of the test needle 2, the probe tip 5 is moved over a certain distance, e.g. 5 mm, along a straight line 21 which is at right-angles to the planes spanned by the upper and lower retaining arms respectively in their original position.

Since the direction 19 in which the test probe 1 is moved towards the circuit board is exactly opposite to the direction of movement 20 of the test needle relative to the mount 10, and the probe tip is moved along a straight line parallel to the direction of movement 20, no movement component is generated parallel to the surface of the circuit board to be tested, thereby ensuring that the probe tip 5 does not scratch the surface of the circuit board. The probe tip is consequently not moved when the test probe is placed on the test piece.

Preferably the movement of the test probe 1 is controlled by the signal detected by the photoelectric switch. If the test needle 2 is moved in direction of movement 20, then the measuring vane 17 enters the optical measuring section, which is detected by a corresponding electrical signal. Since the signal is proportional to the path of the test needle 2, the measuring signal may be used to determine how far the test needle has been moved from the original position. From a certain deflection distance, e.g. 1 mm, the movement of the test probe 1 can be braked.

By this means the maximum deflection of the test needle 2 relative to the mount 10 is limited, which in turn limits the spring force exerted by the retaining arms on the circuit board via the test needle 2. The force exerted on a circuit board can thus be kept very low, and even when the test probe 1 is moved at high speed towards the circuit board to be tested, the surface of the latter will not be damaged owing to the low movement impulse transmitted and the limited spring force.

Figure 3:
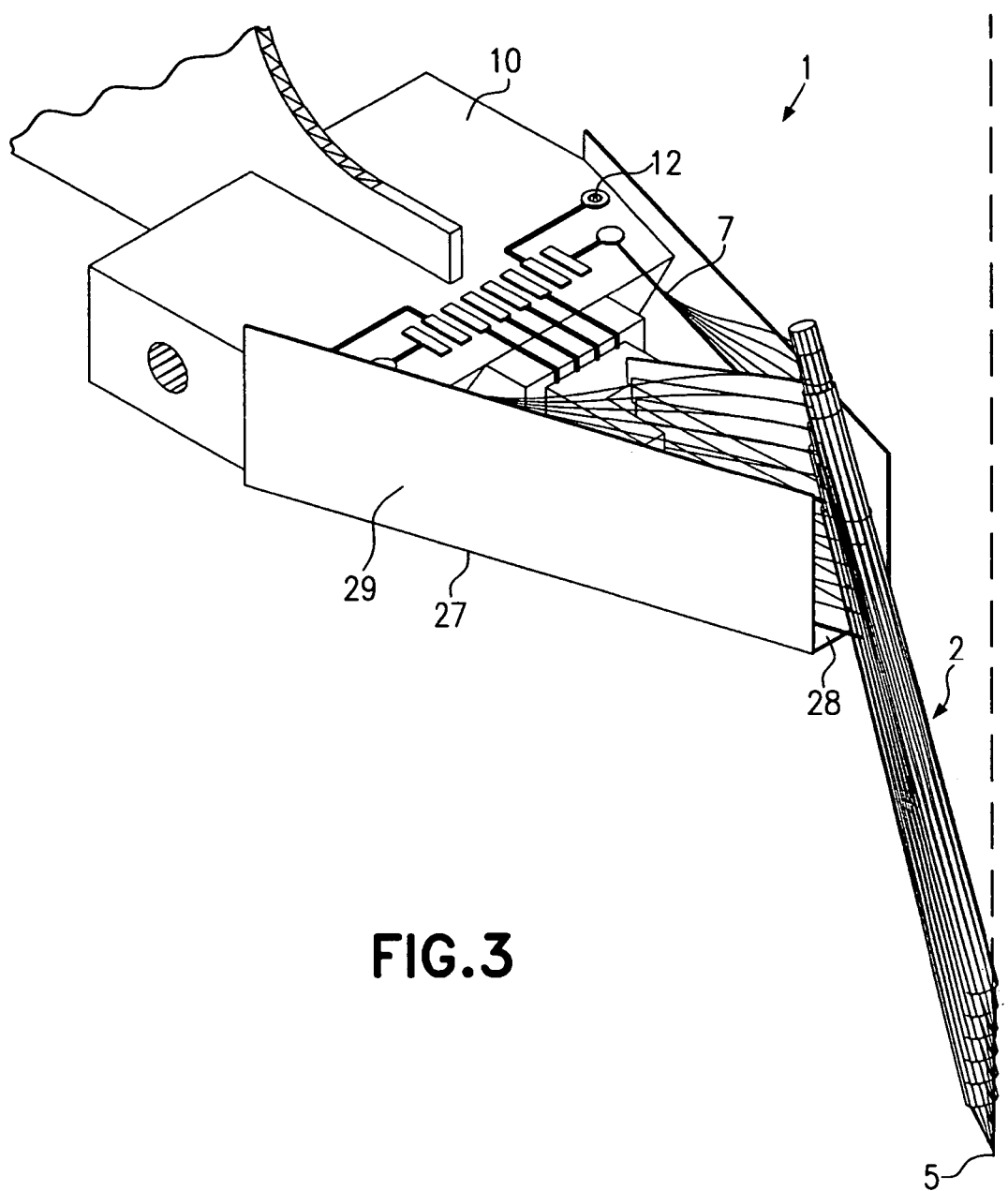
FIG. 3 is a perspective view of a second embodiment of a test probe according to the invention.
Figure 4:
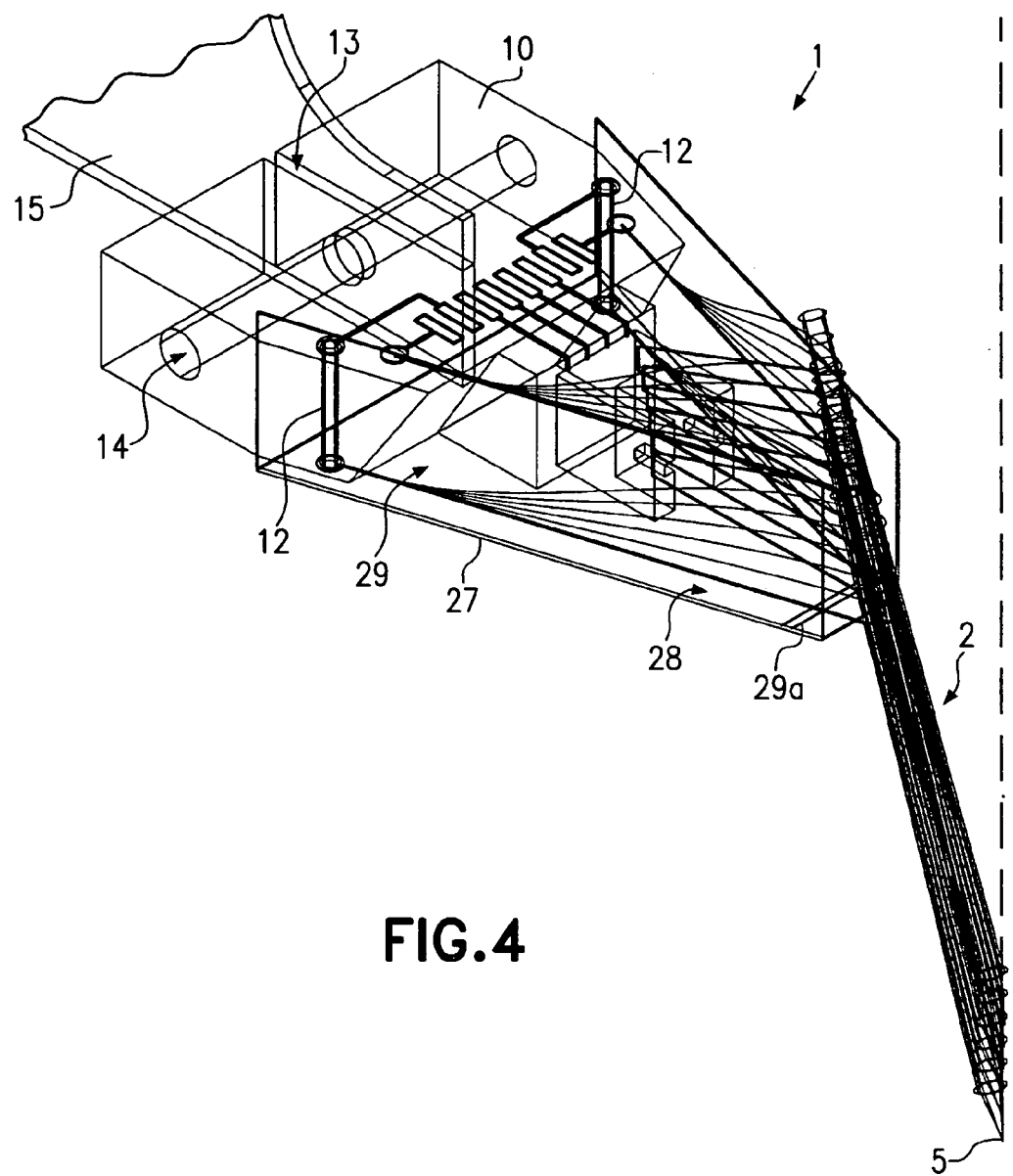
FIG. 4 is a perspective view of the test probe of FIG. 3 in a view in which the individual elements are shown transparently.

FIGS. 3 and 4 show a second embodiment in which the retaining arms 6 to 9 are mounted inside an electrically conductive trough 27, which shields the retaining arms acting as electrical leads from electrical radiation. This trough 27 has a base 28 and two side walls 29.

Like the lower retaining arms 8, 9, the trough 27 is electrically connected to the pins 12, which are earthed. Adjacent to the test needle 2 on the base 28 is a transverse web 30, which limits the movement of the lower retaining arms 8, 9 downwards, with the transverse web 30 being fitted higher than the fastening point of the lower retaining arms 8, 9 to the mount 10. This means that the unit comprising the test needle 2 and the retaining arms 7 to 9 is raised a little upwards compared to the original position shown in FIG. 1, and the retaining arms 6 to 9 are under pre-tension.

This pre-tension has the effect that, during rapid acceleration of the test probe 1, due to the forces occurring in the acceleration, the test needle 2 is not moved relative to the mount 10, which might lead to its measuring vane triggering the photoelectric switch in an undesired manner.

Within the scope of the invention it is also possible to provide, instead of a trough, a tubular shield element which also shields the retaining arms from above.

Figure 6:
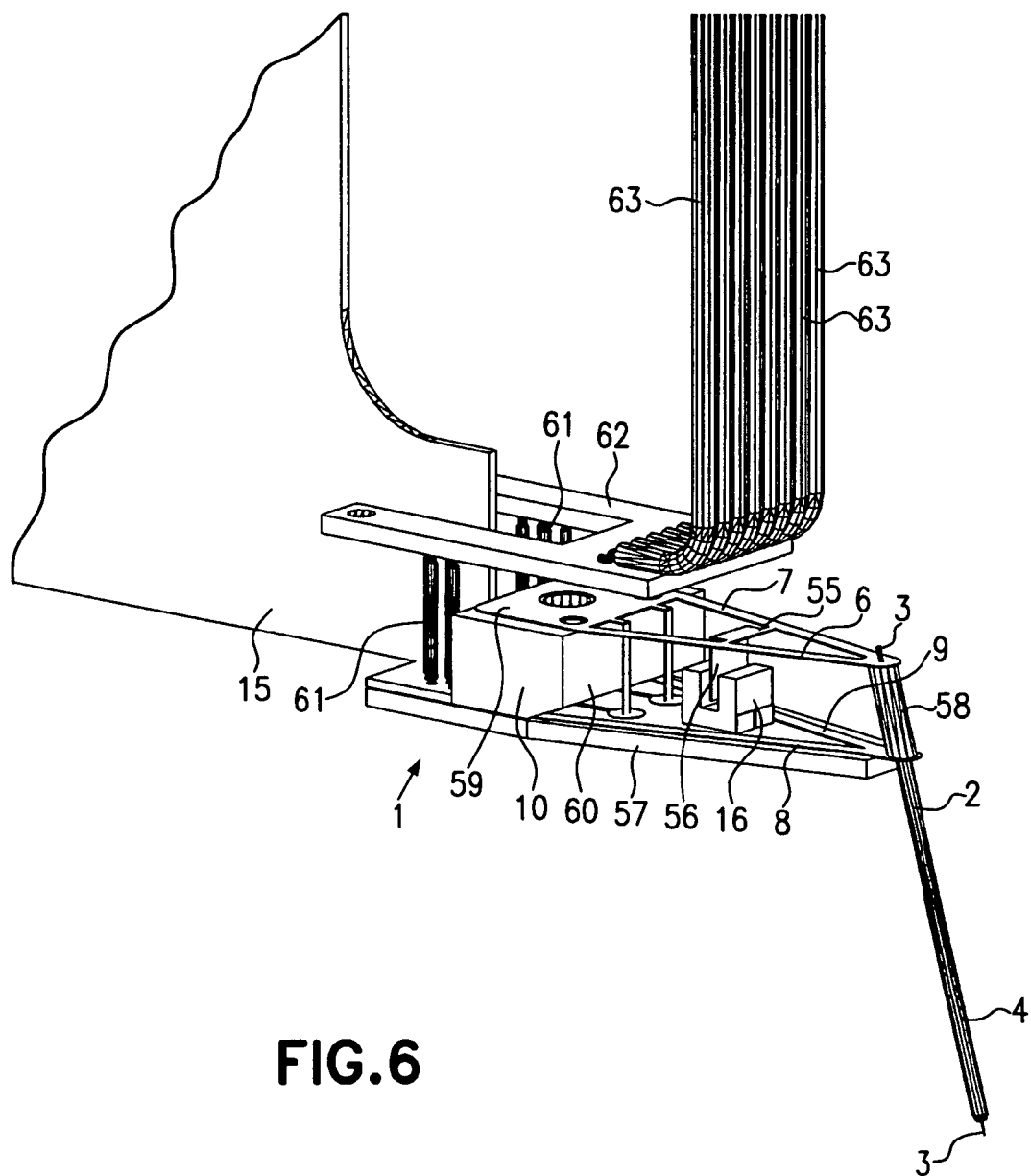
FIG. 6 is a perspective view of the test probe of FIG. 5 without the housing.

A third embodiment of the test probe (FIGS. 5, 6) is similar in design to the two embodiments described above, for which reason similar parts are provided with the same reference numbers. The two upper retaining arms 6, 7 and the two lower retaining arms 8, 9 are in each case produced by etching from a thin copper/beryllium sheet or from sprung steel with a wall thickness of around 50 □m to 200 □m. Any type of sheet metal with good electrical conductivity and good elastic properties is suitable. The pairs of retaining arms are therefore narrow strips of sheet metal, V-shaped when viewed from above. Formed roughly in the longitudinal centre between the upper retaining arms 6, 7 is a transverse web 55, to which a measuring vane 56 is bonded and bent downwards. The transverse web is located at that point on the retaining arms at which the direction of curvature of the retaining arms changes on deflection (=point of inflection) (FIG. 7).

The measuring vane 56 in turn has a measuring edge (not shown), which engages in the photoelectric switch element 16. This measuring edge is however aligned horizontally and the light source and the light sensor extend vertically, so that the photoelectric switch element 16 emits a signal proportional to the insertion depth of the measuring vane 56. The retaining arms 6, 7 and 8, 9 respectively end at a plate 59 which is fastened to the mount 10 by, for example, a bonded, screw or rivet connection.

The lower retaining arms 8, 9 lie on a base plate 57 which is made of a non-electrically conductive material. Viewed from above, the base plate 57 is V-shaped in the area from the mount 10 to the test needle 2, i.e. tapering from the mount 10 towards the test needle 2. The base plate 57 limits the downwards movement of the retaining arms.

As in the two embodiments described above, the test needle 2 is provided and arranged with a needle 3 and a shield 4. In the area between the lower and upper retaining arms 8, 9 and 6, 7 it has a spacer sleeve 58, which is made of electrically-insulating material and surrounds the shield 4 in the area between the retaining arms 8, 9 and 6, 7. The spacer sleeve 58 is physically connected to the retaining arms 6, 7 and 8, 9, so that the retaining arms are held at a distance by their end which is furthest away from the mount 10. The upper retaining arms 6, 7 are electrically connected to the needle 3, and the lower retaining arms 8, 9 are electrically connected to the shield 4.

In this embodiment the mount 10 is a roughly square body, fitted on to the base plate 57, with the plate of the lower retaining arms 8, 9 located between the mount 10 and the base plate 57. The bottom edge of the wall 60 of the mount 10 facing the test needle 2 is beveled, so that the lower retaining arms 6, 7 are slightly exposed and are able to move freely upwards from an area behind the wall 60.

On the side facing away from the test needle 2, the base plate 57 extends outwards a little from the mount 10. In this area, contact points are arranged on the base plate 57, from which contact pins 61 lead upwards and end at a contact plate 62. Fastened to the latter are electrical wires 63 which are electrically connected to the contact pins 61, and by which the test probe 1 is electrically connected to the tester. In this area the base plate 57 is also physically connected to the wall 15 of the test head.

Via conductor paths on the base plate 57, the photoelectric switch element 16 and the upper retaining arms 6, 7 are electrically connected to the contact pins 61, while connecting webs 67 lead downwards from the plate 59 of the upper retaining arms to the base plate 57, and are contacted at corresponding conductor paths.

In its mode of operation, the third embodiment of the test probe corresponds to the two embodiments described above.

In a further embodiment, instead of one test needle per test probe, it is possible to have two test needles arranged parallel adjacent to one another and supported by the retaining arms, so that a 4-wire measurement may be made, in which this circuit containing the current source and that containing the voltage source are brought together only at the circuit board test point 22.

Figure 8:
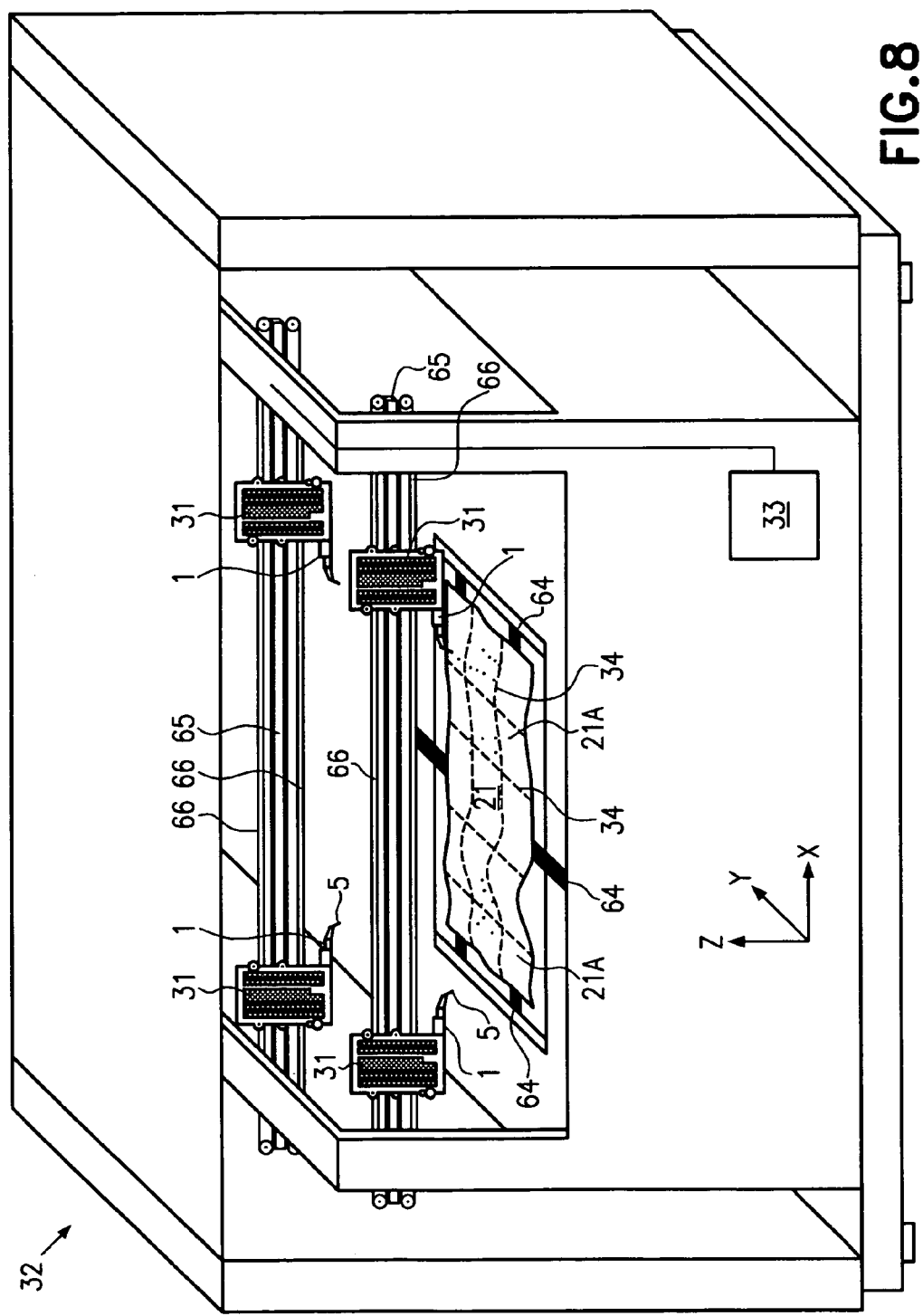
FIG. 8 is a schematic perspective view of a finger tester according to the invention.

FIG. 8 shows in schematic form a tester 32 for the testing of non-componented circuit boards 21, which is a finger tester 32. The finger tester has several test heads 68, each formed by a test probe 1 according to the invention and a linear drive 31. The linear drive 31 is mounted so that it is aligned substantially at right-angles to the circuit board 21 to be tested, i.e. the test probe 1 may be moved by the linear drive 31 in a direction substantially at right-angles to the circuit board 21. Preferably the linear drive 31 is a linear motor, as described for example in German patent application DE 101 60 119.0-35. Any other suitable drive unit may however be used as the linear drive.

The finger tester 32 has an area for holding the circuit board to be tested 21, which is held by means of retaining elements 64. Located in the area above this holding area is at least one cross-bar 65 which extends over this holding area. Preferably there are several cross-bars 65, fixed to or also movable on the finger tester. If the cross-bars 65 are fixed immovably to the finger tester, then the test heads are provided with a swivel unit, by means of which at least the test probe 1 concerned may be swiveled around a vertical axis.

Each of the test heads 68 is coupled to a conveyor belt 66, by means of which it may be automatically traversed along the respective cross-bar 65. Preferably two test heads 68 are mounted on a cross-bar, so that two conveyor belts 66 are fitted to each of the cross-bars 65.

In operation the test probes 1 with their probe tips 5 are positioned, by means of a movement in the plane parallel to the circuit board 21, over a circuit board test point 22 to be tested. The contact tip is then lowered on to the circuit board test point 22 by means of the linear drive 31, until the probe tip 5 contacts the circuit board test point. The electrical measurement then takes place, after which the test probe is again raised and then traversed to the next circuit board test point.

The finger tester shown in FIG. 8 has test heads on only one side of the circuit board 21 to be tested. Within the scope of the invention it is of course possible to design the finger tester to have test heads, cross-bars, etc. on both sides of the circuit board to be tested.

The tester 32 according to the invention has a controller 33, shown schematically in FIG. 8 by a rectangle, and designed for automatic control of movement of the test probe 1 in all three spatial directions. By means of the photoelectric switch elements 16 of the probe 1 which serve as contact sensors, the controller 33 determines the point in time at which the circuit board 21 to be tested is contacted. If at this point in time the Z coordinate of the probe tip 5 is detected, then the height of the circuit board 21 to be tested at the relevant contact point of the circuit board 21 to be tested is established.

By this means and in this way the height of the surface of the circuit board 21 to be tested is determined by the method according to the invention. In a further contacting process, the test probe is controlled on the basis of the previously determined height of the surface of the circuit board 21, i.e. the test probe is moved in the Z direction at a high traversing speed with the probe tip 5 up to the height in the Z direction, and is braked only on reaching this height, or shortly before it. Shortly before means that the test probe is braked on reaching a distance of less than 1 or 2 millimeters between the probe tip 5 and the detected surface of the circuit board. The test probe 1 is then moved at a lower speed until, by means of the contacting sensors 16, actual contact with the surface of the circuit board 21 is detected.

By this means the testing process is automatically adapted to the level of the surface of the circuit board 21 to be tested, which may often vary somewhat.

Preferably the movement of the test probes in the Z direction is controlled in such a way that, in contacting the circuit board to be tested, the test probes are stopped when the contacting sensors 16 detect a certain contact force by which the probe tip 5 is pressed against the surface of the circuit board. In the case of the contacting sensors 16 according to the present embodiment, the predetermined contact force corresponds to a certain amount of light detected by the photoelectric switch elements. If during the contact with a circuit board, a change in the amount of light or contact force respectively is detected, then the test probes are readjusted accordingly in the Z direction. This is a great advantage in the testing of flexible circuit boards, since it may occur that several test fingers contact a flexible circuit board simultaneously at circuit board test points which are close together. This may cause the flexible circuit board to be pressed through a little, resulting in a change of position of the circuit board surface. The individual test probes are accordingly traced, so that even with a surface form changing over time in this way, reliable contacting with predetermined contact force is ensured.

According to a preferred embodiment of the method according to the invention, not just one level of the surface of the circuit board 21 to be tested is determined, but instead the levels of several points on the circuit board are determined, and the surface of the circuit board 21 to be tested is simulated by means of interpolation. This is of particular advantage in the case of flexible circuit boards, since such circuit boards may become wavy due to their flexibility, thus assuming a three-dimensional surface in the tester 32. In FIG. 8, hypothetical grid lines 34 are plotted. In testing an individual circuit board 21 to be tested, at the start of the testing process the levels in the area of the intersection points of the grid lines 34 are detected. With the aid of these levels, the whole surface of the circuit board to be tested is simulated by an interpolation process.

With the aid of this simulated surface, the controller 33 automatically determines the Z coordinates of each individual circuit board test point to be tested. This means that each individual circuit board test point to be tested may be controlled individually in respect of its Z coordinates, with the test probe with its probe tip 5 being moved at high speed up to or shortly before the level of the individual circuit board test point, after which the test probe 1 is braked until actual contact is detected by means of the contacting sensor.

In the case of three-dimensional circuit boards, in particular wavy circuit boards, a significant saving in time in circuit board testing is obtained, since the individual circuit board test points to be tested are controlled by their actually determined Z coordinates.

In the case of circuit boards with a high degree of waviness, the waviness of the circuit board may also lead to deviations of the X and Y coordinates of the circuit board test points from the desired coordinates. Since the shape of the surface of the circuit board is simulated, it is easy to use the simulation to determine the relevant deviations.

With conventional testers, in particular if they have no contacting sensor, there is also the problem that wavy circuit boards can often not be contacted correctly with a sensor located above the circuit board, if the circuit board bends downwards, since the test probe is not moved down to this extent. Even such circuit boards bent away by the test probes 1 are contacted reliably by the method according to the invention, while in addition it is also possible for all circuit board test points to be approached quickly.

For the method of interpolation, preferably the spline interpolation method is used. In this, a curve is drawn through predetermined points of the plane to be simulated with the aid of a spline function $$s: [x_1, x_n] \to R$$

This is established by the following conditions:
a) s ($x_i=y_i$) i.e., the starting points lie on the graph of s;
b) s=[$x_1, x_n$] may be constantly differentiated twice;
c) the overall curvature of s is minimal, i.e. all other functions which satisfy the first two conditions have a greater overall curvature.

It has been found that for each interval [$x_i, x_{i+1}$], s is at most a third order polynomial. Because of this, the spline interpolation gives very smooth curves.

Thus, in a simple manner, the method according to the invention matches the measuring procedure to the level of a circuit board to be tested.

The invention may be summarized briefly as follows:

Using the method according to the invention, the level of the surface of a circuit board to be tested is detected automatically in a contacting process, and the further contacting operations are then controlled on the basis of the detected level.

By this means, control of the movement of the test probes of the finger tester involves automatic adaptation to the level. This is of particular value in the testing of flexible circuit boards, since their surface may assume a three-dimensional shape.

While this invention has been particularly shown and described with references to preferred embodiments thereof, it will be understood by those skilled in the art that various changes in form and details may be made therein without departing from the scope of the invention encompassed by the appended claims.

LIST OF REFERENCE NUMBERS

1—test probe, 2—test needle, 3—needle, 4—shield, 5—probe tip, 6—retaining arm, 7—retaining arm, 8—retaining arm, 9—retaining arm, 10—mount, 11—contact pad, 12—pin, 13—slot, 14—through hole, 15—test head wall, 16—photoelectric switch element, 16a—base, 16b—limb, 17—measuring vane, 18—measuring edge, 19—direction of movement for contacting, 20—direction of movement, 21—circuit board, 21a—conductor path, 22—circuit board test point, 23—conductor, 24—current source, 25—conductor, 26—voltmeter, 27—trough, 28—base, 29—side wall, 30—transverse web, 31—linear drive, 32—tester, 33—controller, 34—grid lines, 55—transverse web, 56—measuring vane, 57—base plate, 58—spacer sleeve, 59—plate, 60—wall, 61—contact pin, 62—contact plate, 63—conductor, 64—retaining element, 65—cross-bar, 66—conveyor belt, 67—connecting web, 68—test head.

What is claimed is:

1. Method of testing non-componented printed circuit boards using a finger tester with several fingers which are automatically traversed to contact circuit board test points of a circuit board to be tested, in which each of the test fingers has a test probe provided with a contacting sensor, which is used to determine when a probe tip of the test probe comes into contact with the surface of the circuit board to be tested so that, with the aid of this point in time and the position of the probe tip at this point in time, the level of the surface of the circuit board to be tested is determined, the level being a height of the surface of the circuit board in a direction that is perpendicular to the plane of the circuit board, and contacting processes for contacting further circuit board test points may be controlled on the basis of the determined level.

2. Method according to claim 1, characterized in that, in contacting the circuit board test point, the test probes are moved at high speed towards the circuit board test point and are braked to a lower speed on reaching or shortly before the level determined in advance.

3. Method according to claim 2, characterized in that the movement of the test probe in contacting the circuit board test point is stopped as soon as contact with the circuit board is detected by the contacting sensor.

4. Method according to claim 3, characterized in that the contacting sensor determines a certain contact force by which the test probe is pressed against the circuit board to be tested and, in the event of any deviation of the detected contact force from a predetermined contact force, the test probe is readjusted.

5. Method according to claim 4, characterized in that the levels of several points distributed over the circuit board are detected and, with the aid of the detected levels, the surface of the circuit board is simulated by an interpolation process, with the simulated surface being used to control further contacting operations.

6. Method according to claim 5 characterized in that the method of interpolation is the spline interpolation method.

7. Method according to claim 6, characterized in that, with the aid of the simulated surface, variations in the X coordinates and Y coordinates of circuit board test points to be tested are calculated in comparison with the desired coordinates and the circuit board test points are controlled on the basis of these changed X coordinates and Y coordinates.

8. Method according to claim 7, characterized in that a flexible circuit board is tested.

9. Method according to claim 8, characterized in that as contacting sensor, a photoelectric switch element with an optical measuring section is used, in which a vane connected to a test needle engages to interrupt the optical measuring section.

10. Method according to claim 9, characterized in that the test needle is pivotably fastened by two pairs of elastically sprung retaining arms to a mount, wherein each pair of retaining arms is arranged in a plane with one end secured to the test needle and the other end to the mount, and each pair of retaining arms forms a triangle viewed from above.

11. Method according to claim 1, characterized in that the contacting sensor determines a certain contact force by which the test probe is pressed against the circuit board to be tested and, in the event of any deviation of the detected contact force from a predetermined contact force, the test probe is readjusted.

12. Method according to claim 1, characterized in that the levels of several points distributed over the circuit board are detected and, with the aid of the detected levels, the surface of the circuit board is simulated by an interpolation process, with the simulated surface being used to control further contacting operations.

13. Method according to claim 12, characterized in that the method of interpolation is the spline interpolation method.

14. Method according to claim 1, characterized in that, with the aid of the simulated surface, variations in the X coordinates and Y coordinates of circuit board test points to be tested are calculated in comparison with the desired coordinates and the circuit board test points are controlled on the basis of these changed X coordinates and Y coordinates.

15. Method according to claim 1, characterized in that a flexible circuit board is tested.

16. Method according to claim 1, characterized in that as contacting sensor, a photoelectric switch element with an optical measuring section is used, in which a vane connected to a test needle engages to interrupt the optical measuring section.

17. Method according to claim 1, characterized in that the test needle is pivotably fastened by two pairs of elastically sprung retaining arms to a mount, wherein each pair of retaining arms is arranged in a plane with one end secured to the test needle and the other end to the mount, and each pair of retaining arms forms a triangle viewed from above.

18. Tester for testing non-componented printed circuit boards, comprising:
a finger tester with several test fingers which are automatically traversed to contact circuit board test points of a circuit board to be tested, in which each of the test fingers has a test probe provided with a contacting sensor, which is used to determine when a probe tip of the test probe comes into contact with the surface of the circuit board to be tested; and
a controller for determining a level of the surface of the circuit board to be tested, the level being a height of the surface of the circuit board in a direction that is perpendicular to the plane of the circuit board, the controller determining the level of the surface of the circuit board using the contacting sensor of the finger tester by monitoring when the contacting sensor indicates that the test probe has come into contact with the surface of the circuit board and a position of the probe tip at this point in time, and the controller then controlling contacting processes for contacting further circuit board test points on the basis of the determined level.

19. A tester according to claim 18, wherein the controller controls the tester so that, in contacting the circuit board test point, the test probes are moved at high speed towards the circuit board test point and are braked to a lower speed on reaching or shortly before the level determined in advance.

20. A tester according to claim 19, wherein the controller controls the tester so that the movement of the test probe in contacting the circuit board test point is stopped as soon as contact with the circuit board is detected by the contacting sensor.

21. A tester according to claim 18, wherein the controller controls the tester so that the contacting sensor determines a certain contact force by which the test probe is pressed against the circuit board to be tested and, in the event of any deviation of the detected contact force from a predetermined contact force, the test probe is readjusted.

22. A tester according to claim 18, wherein the controller controls the tester so that the levels of several points distributed over the circuit board are detected and, with the aid of the detected levels, the surface of the circuit board is simulated by an interpolation process, with the simulated surface being used to control further contacting operations.

23. A tester according to claim 22, wherein the interpolation is the spline interpolation method.

24. A tester according to claim 22, wherein the controller controls the tester so that, with the aid of the simulated surface, variations in the X coordinates and Y coordinates of circuit board test points to be tested are calculated in comparison with the desired coordinates and the circuit board test points are controlled on the basis of these changed X coordinates and Y coordinates.

25. A tester according to claim 18, wherein a flexible circuit board is tested.

26. A tester according to claim 18, wherein the contacting sensor is a photoelectric switch element with an optical measuring section, in which a vane connected to a test needle engages to interrupt the optical measuring section.

27. A tester according to claim 18, wherein the test needle is pivotably fastened by two pairs of elastically sprung retaining arms to a mount, wherein each pair of retaining arms is arranged in a plane with one end secured to the test needle and the other end to the mount, and each pair of retaining arms forms a triangle viewed from above.

28. A method of testing non-componented printed circuit boards using a finger tester with several fingers which are traversed to contact circuit board test points of a circuit board to be tested, at least one of the test fingers having a test probe and a contacting sensor, which is used to determine when a probe tip of the test probe contacts a surface of the circuit board to be tested, the method comprising:
determining a level of the surface of the circuit board to be tested in response to the contacting sensor, the level being a height of the surface of the circuit board in a direction that is perpendicular to the plane of the circuit board; and
using the determined level of the surface of the circuit board to be tested when contacting further circuit board test points.

29. A method as claimed in claim 28, further comprising when contacting the further circuit board test points, the test probe is moved towards the circuit board test points and the speed of the test probe is reduced based on the determined level of the surface of the circuit board to be tested.

30. A method as claimed in claim 28, further comprising stopping movement of the test probe in response to contact with the circuit board as detected by the contacting sensor.

31. A method as claimed in claim 28, further comprising: determining levels of several points distributed over the circuit board to be tested; and calculating a level of the surface of the circuit board to be tested at other points using the determined levels.

32. A method as claimed in claim 28, further comprising monitoring an optical signal to determine contact of the probe tip with the surface.

33. A tester for testing non-componented printed circuit boards, comprising:
a finger tester with several test fingers which are moved to contact circuit board test points of a circuit board to be tested, at least one of the test fingers including a test probe and a contacting sensor, which is used to determine when a probe tip of the test probe contacts a surface of the circuit board to be tested; and
a controller for determining a level of the surface of the circuit board to be tested in response to the contacting sensor, the level being a height of the surface of the circuit board in a direction that is perpendicular to the plane of the circuit board, the controller determining the level of the surface of the circuit board using the contacting sensor of the finger tester by monitoring when the contacting sensor indicates that the test probe has come into contact with the surface of the circuit board and a position of the probe tip at this point in time, and the controller then controlling contacting processes for contacting further circuit board test points on the basis of the determined level.

34. A tester as claimed in claim 33, wherein the controller controls the tester so that, in contacting the circuit board test point, the test probes are moved towards the circuit board test point and are slowed in response to the determined level of the surface of the circuit board to be tested.

35. A tester as claimed in claim 33, wherein the controller controls the tester to stop movement of the test probe in response to the contacting sensor.

36. A tester as claimed in claim 33, wherein the controller controls the tester to determine the levels of the surface of the circuit board to be tested at several points with reference to one or more of the contacting sensors and calculates a level of the surface at other points in response to the determined levels of the surface.

37. A tester as claimed in claim 33, wherein the contacting sensor comprises:
 a photoelectric switch element; and
 a vane connected to the test needle that interrupts an optical signal received by the photoelectric switch.

* * * * *